United States Patent [19]
Kobayashi

[11] Patent Number: 5,678,225
[45] Date of Patent: Oct. 14, 1997

[54] DIRECT-COUPLED ACTIVE BALANCED MIXER

[75] Inventor: Kevin W. Kobayashi, Torrance, Calif.

[73] Assignee: TRW Inc., Redondo Beach, Calif.

[21] Appl. No.: 500,725

[22] Filed: Jul. 11, 1995

[51] Int. Cl.[6] .................................. H04B 1/16
[52] U.S. Cl. ..................... 455/330; 455/326; 455/333
[58] Field of Search ..................... 455/323–326, 455/330, 333; 327/119, 120, 123, 355, 356

[56] References Cited

U.S. PATENT DOCUMENTS

| | | |
|---|---|---|
| 4,603,435 | 7/1986 | Butler . |
| 4,637,069 | 1/1987 | Charbonnier ........................... 455/330 |
| 4,896,374 | 1/1990 | Waugh et al. . |
| 4,994,755 | 2/1991 | Titus et al. . |
| 5,060,298 | 10/1991 | Waugh et al. . |
| 5,175,885 | 12/1992 | Lange et al. ........................... 455/330 |

*Primary Examiner*—Chi H. Pham
*Attorney, Agent, or Firm*—Michael S. Yatsko

[57] ABSTRACT

A low power, high-performance mixer includes a Schottky diode ring and first and second active baluns. The first active balun has an input coupled to a radio frequency (RF) signal and generates a first intermediate frequency (IF) output and a set of balanced RF outputs which are directly coupled to the Schottky diode ring. A second active balun has an input coupled to a local oscillator (LO) signal and generates a second IF output and a set of balanced LO outputs which are directly coupled to the diode ring. An IF output combiner, coupled to the first and second IF outputs, generates a combined IF output from the first and second IF outputs. The mixer can alternately be implemented using first and second distributed active baluns which are directly coupled to the diode ring.

31 Claims, 3 Drawing Sheets

DIRECT-COUPLED ACTIVE BALANCED MIXER

BACKGROUND OF THE INVENTION

1. Technical Field

This invention relates to mixers, and, more particularly, to mixers with directly coupled active baluns.

2. Background

Because of ever-increasing performance demands, mixers used in commercial applications such as cellular telephones, high definition television and other circuits now require high conversion gain, third order intercept points (IP3) and isolation at frequencies less than 6 GigaHertz (GHz). Such mixers should also operate at a low direct current (DC) voltage typically less than 3.6 volts. Mixers employed in devices utilizing batteries also require low DC power consumption to maximize battery life. Finally, such mixers should also have a low cost implementation which requires that the mixer be relatively small in size. Conventional mixers generally fail to accomplish all of these objectives in one mixer design.

Conventional Gilbert cell mixers achieve positive conversion gain, moderate IP3, and good isolation performance. Gilbert cell mixers are active and small in area. The main performance disadvantage of Gilbert cell mixers is that large amounts of DC power must be used in order to obtain reasonable IP3s.

Conventional field effect transistor (FET) dual-gate mixers can also be designed for positive conversion gain and medium IP3, but have poor isolation performance which is limited by the local oscillator (LO), radio frequency (RF) and intermediate frequency (IF) filters at each port. The filters become cumbersome to implement at lower frequencies, and the quality factor (Q) required cannot be readily realized on lossy semi-insulating gallium arsenide (GaAs) substrates. In addition, FET dual-gate mixers have stability problems.

Conventional Schottky diode double-balanced and double-double-balanced mixer designs achieve conversion losses on the order of 6 to 10 decibels (dB) and can obtain high IP3 and good isolation performance while dissipating little or no DC power. However, conventional Schottky mixers employ passive baluns which consume large areas, especially at frequencies <2 GHz and are limited to about an octave of bandwidth.

Recently, active baluns in FET technology have been developed which can realize multi-octave bandwidths. However, the FET mixers with active baluns are not directly coupled and therefore cannot be used down to baseband frequencies. These active baluns use distributive common-source and common-gate FETs to realize the in-phase and anti-phase balanced operation. The typical size of one of these active baluns alone is 1.87 ×1.73 mm² (larger than a monolithic passive lumped-element balun). The main advantage of the active FET baluns is in broadband microwave and millimeter-wave frequencies.

Table I set forth below summarized conventional mixer designs:

TABLE 1

MIXER TYPES

| Mixer Types | Conversion Gain | IP3 | Isolations | Typical DC Power | Size/Cost |
|---|---|---|---|---|---|
| Gilbert-Cell Active Mixer | positive | medium (0 dBm) | good (>30 dB) | high (60 mW) | small (0.35 × 00.35) mm² |
| Dual-Gate FET Mixer | positive | medium | poor | high | medium lumped element filters |
| Schottky ring-quad Balanced Mixer | negative (−6 dB) | high (+10 dBm) | good (>30 dB) | low (0) | Large (>3 × 2 mm² at K-band) passive lumped element baluns |
| Schottky double ring-quad Balanced Mixer | negative (−10 dB) | high (+10 dBm) | good (>30 dB) | low (0) | Large (3 × 2 mm² at X-band) passive lumped element baluns |

Therefore, a single mixer design providing high conversion gain, IP3 and isolation at frequencies less than 6 GHz while requiring a low DC voltage and dissipating low DC power, and consuming small chip areas is desirable.

SUMMARY OF THE INVENTION

A low-power, high performance mixer according to the invention includes a diode ring and first and second active baluns. The first active balun has an input coupled to a radio frequency (PAT) signal. The first active balun generates a first intermediate frequency (IF) output and a set of balanced RF outputs which are directly coupled to the diode ring. The second active balun has an input coupled to a local oscillator (LO) signal. The second active balun generates a second IF output and a set of balanced LO outputs which are directly coupled to the diode ring.

In accordance with a preferred embodiment of the invention, the first active balun includes a plurality of transistors. A non-inverting RF output of the first active balun is directly coupled to an anode of the first diode. The inverting RF output of the first active balun is directly coupled to an anode of the third diode. The second active balun includes a plurality of transistors. A non-inverting LO output of the second active balun is directly coupled to an anode of the fourth diode. An inverting LO output of the second active balun is directly coupled to an anode of the second diode.

In accordance with another preferred embodiment of the invention, the active balanced mixer has wideband operation. The wideband mixer includes a diode ring and a first distributed device having an input coupled to a radio frequency signal and a first plurality of differential amplifiers. The first distributed device generates a first intermediate frequency output and a set of balanced radio frequency outputs which are directly coupled to the diode ring. A second distributed device has an input coupled to a local oscillator signal and includes a second plurality of distributed amplifiers. The second distributed device generates a second intermediate frequency output and a second set of balanced local oscillator outputs which are directly coupled to the diode ring.

In another aspect of the invention, a wideband mixer includes a diode ring and first and second distributed active baluns.

The mixer designs of the present invention are characterized by improved gain, IP3 and isolation yet require comparatively lower DC operating voltages while dissipating low power.

Still other objects, features and advantages will be readily apparent.

BRIEF DESCRIPTION OF THE DRAWINGS

The various advantages of the present invention will become apparent to those skilled in the art after studying the following specification and by reference to the drawings in which.

DESCRIPTION OF THE PREFERRED EMBODIMENT

Figure 1:
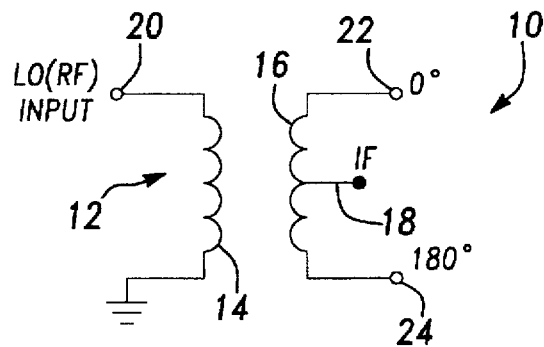
FIG. 1 illustrates a conceptual electronic schematic of a prior art balun represented as a transformer with an intermediate frequency (IF) center tap.

In FIG. 1, a conceptual schematic of a balun 10 according to the prior art is illustrated. The balun 10 can be represented as a transformer 12 having a primary winding 14 and secondary winding 16 with a center tap 18. The transformer 12 converts a single-ended local oscillator (LO) or radio frequency (RF) input signal at node 20 into two out-of-phase complementary signals for driving two vertexes of a diode ring quad. An intermediate frequency (IF) output is taken at center tap 18 of the balanced output. As can be appreciated, a non-inverting output is generated at node 22 and inverting output is generated at node 24. The balun of FIG. 1 is a passive balun and thus does not provide gain.

Figure 2:
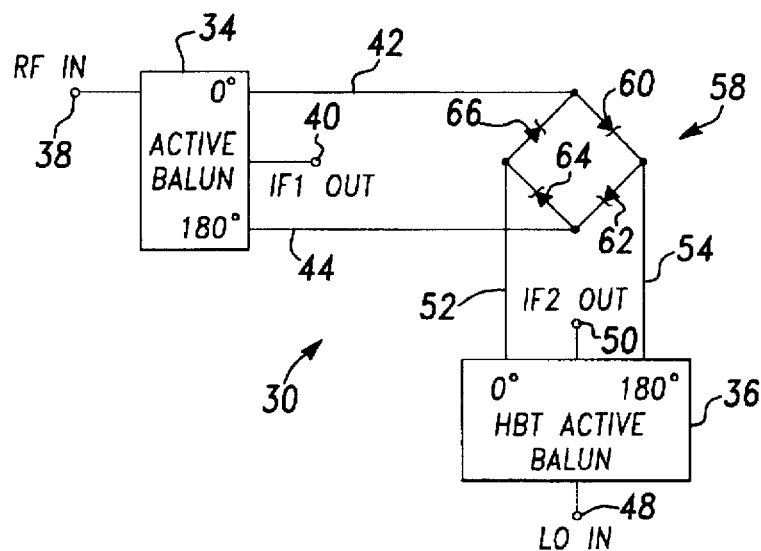
FIG. 2 is a block diagram of an active double-balanced Schottky mixer including first and second active baluns according to the present invention.

In FIG. 2, an active balanced Schottky diode mixer 30 according to the invention is illustrated and includes first and second active baluns 34 and 36. Active balun 34 has an input node 38 which is preferably connected to an RF input. Active balun 34 further includes an intermediate frequency output node 40, a non- inverting output 42, and an inverting output 44.

The second active balun 36 includes an input node 48 which is preferably coupled to a local oscillator (LO) input. Second active balun 36 further includes an intermediate frequency output node 50, a non-inverting output 52 and an inverting output 54. First and second baluns 34 and 36 preferably have the same electrical construction as will be described further below in connection with FIG. 3 which only illustrates balun 34.

Active balanced Schottky diode mixer 30 further includes a Schottky diode quad 58 including first, second, third and fourth Schottky diodes 60, 62, 64 and 66, respectively. A cathode of first Schottky diode 60 is coupled an anode of Schottky diode 62 and to inverting output 54 of second active balun 36. A cathode of second Schottky diode 62 is coupled to an anode of third Schottky diode 64 and to inverting output 44 of first active balun 34. A cathode of third Schottky diode 64 is coupled an anode of fourth Schottky diode 66 and to a non-inverting output of second active balun 36. A cathode of fourth Schottky diode 66 is coupled to an anode of first Schottky diode 60 and to a non-inverting output 42 of first active balun 34.

First and second active baluns 34 and 36 are identical in topology and are both directly coupled to Schottky diode quad 58. Complementary IF outputs 40 and 50 are respectively tapped off the first and second active baluns 34 and 36 (corresponding to the RF and LO inputs).

Figure 3:
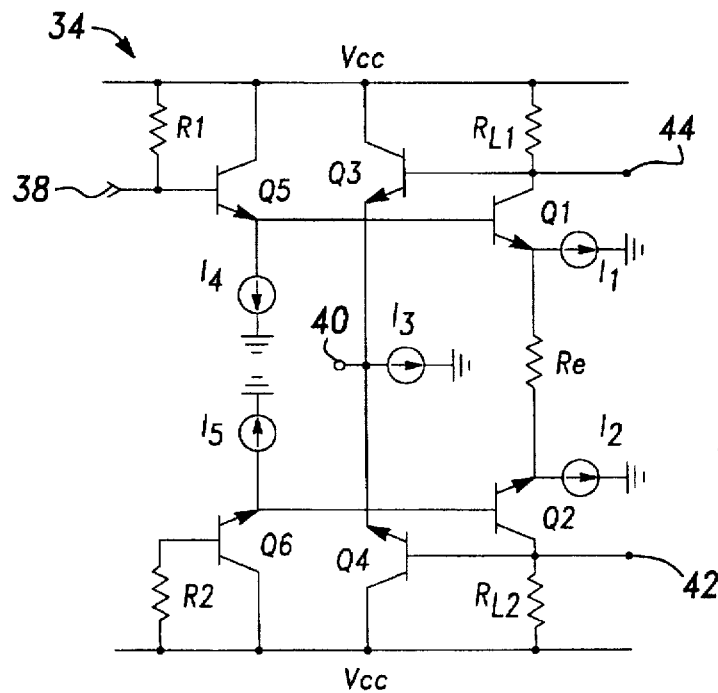
FIG. 3 illustrates the first balun of FIG. 2 in further detail.

In FIG. 3, reference numerals from FIG. 2 have been used where appropriate. The reference numerals from first active balun 34 will be employed in FIG. 3 but it should be apparent to skilled artisans that the second active balun is identical except that the LO input 48 is substituted for RF input 38, non-inverting output 52 is substituted for non-inverting output 42, and inverting output 54 is substituted for inverting output 44.

Active balun 34 includes first, second, third, and fourth transistors $Q_1$, $Q_2$, $Q_3$ and $Q_4$ and first and second load resistors $R_{L1}$ and $R_{L2}$. Inverting output 44 (or inverting output 54 in the case of second balun 36) is coupled to a base of $Q_3$, one end of $R_{L1}$ and a collector of $Q_1$. Non-inverting output 42 (or non-inverting output 52 in the case of the second balun 36) is coupled to a base of $Q_4$, a collector $Q_2$ and one end of $R_{L2}$. Active balun 34 further includes first and second current sources $I_1$ and $I_2$ and an emitter degeneration resistor $R_e$. An emitter of $Q_1$ is coupled to current source $I_1$ and one end of $R_e$. An emitter of $Q_2$ is coupled to current source $I_2$ and an opposite end of resistor $R_e$. Opposite ends of resistors $R_{L1}$ and $R_{L2}$ and collectors of $Q_3$ and $Q_4$ are coupled to a voltage source $V_{cc}$. Emitters of $Q_3$ and $Q_4$ are coupled to IF tap 40 (or IF tap 50 for second balun 36) and to a third current source $I_3$.

First active balun 34 further includes fifth and sixth transistors $Q_5$ and $Q_6$, fourth and fifth current sources $I_4$ and $I_5$, and resistors $R_1$ and $R_2$. Collectors of $Q_5$ and $Q_6$ and one end of resistors $R_1$ and $R_2$ are coupled to voltage source $V_{cc}$. An opposite end of resistor $R_1$ is coupled to a base of transistor $Q_5$ and to RF input 38 (or in case of second balun 36 to the LO input 48). An opposite end of resistor $R_2$ is coupled to a base of transistor $Q_6$ An emitter of transistor $Q_5$ is coupled to current source 14 and a base of transistor $Q_1$. An emitter of transistor $Q_6$ is connected to fifth current source $I_5$ and a base of transistor $Q_2$.

Preferably transistors $Q_1$–$Q_6$ are hetero-junction bipolar transistors (HBT). Preferably resistors $R_1$ and $R_2$ are 50 ohms. In a highly preferred embodiment gallium arsenide (GaAs) transistors are employed.

First active balun 34 consists of a single ended 50 ohm RF input including resistor $R_1$, transistor $Q_5$ and current source $I_4$. A mirror leg includes resistor $R_2$, transistor $Q_6$ and current source $I_5$ is used to create a differential signal which drives the differential amplifier including transistors $Q_1$, $Q_2$, load resistors $R_{L1}$ and $R_{L2}$, emitter degeneration resistor $R_e$, and current sources $I_1$ and $I_2$.

The outputs of the collectors of $Q_1$ and $Q_2$ provide balanced anti-phase complementary outputs. Emitter degeneration resistor $R_e$ can be adjusted to increase the input power handling range of the differential output amplifier as well as to adjust the conversion gain-bandwidth performance. The values of load resistors $R_{L1}$ and $R_{L2}$ can be chosen such that the product of $R_L*I$ is greater than the turn-on voltage of the Schottky diodes. In this manner, balun 36 can be driven by a large LO source which has enough voltage to switch the diodes on under large signal operation.

Because the active RF and LO baluns 34 and 36 are directly coupled to the Schottky diode ring quad 58, the voltage product ($R_L*I$) should be the same for both RF and LO active baluns 34 and 36 so that the diodes of the ring quad 58 are biased with zero voltage bias in the absence of RF and LO signals. This design constraint should be maintained in order to preserve the DC balance of the Schottky diodes as well as the active baluns.

IF center tap 40 includes transistors $Q_3$ and $Q_4$ and current source $I_3$. These transistors combine in-phase IF signals at the emitters of $Q_3$ and $Q_4$. The active balun is self-biased through a single voltage supply $V_{cc}$.

In use, RF input signal is input at node 38 and LO signal is input at node 48. Active balun 34 generates non-inverting RF output at 42 and inverting RF output at 44 which are coupled to diode ring 58. Active balun 36 generates non-inverting LO output at 52 and inverting LO output at 54 which are coupled to ring diode 58. Mixer 30 generates first and second IF outputs at 40 and 50.

As can be appreciated, active balanced Schottky diode mixer 30 with first and second active baluns 34 and 36 provides high conversion gain, IP3 and isolation at frequencies less than 6 GHz while requiring low DC voltage, dissipating low DC power and consuming small chip areas.

Figure 4:
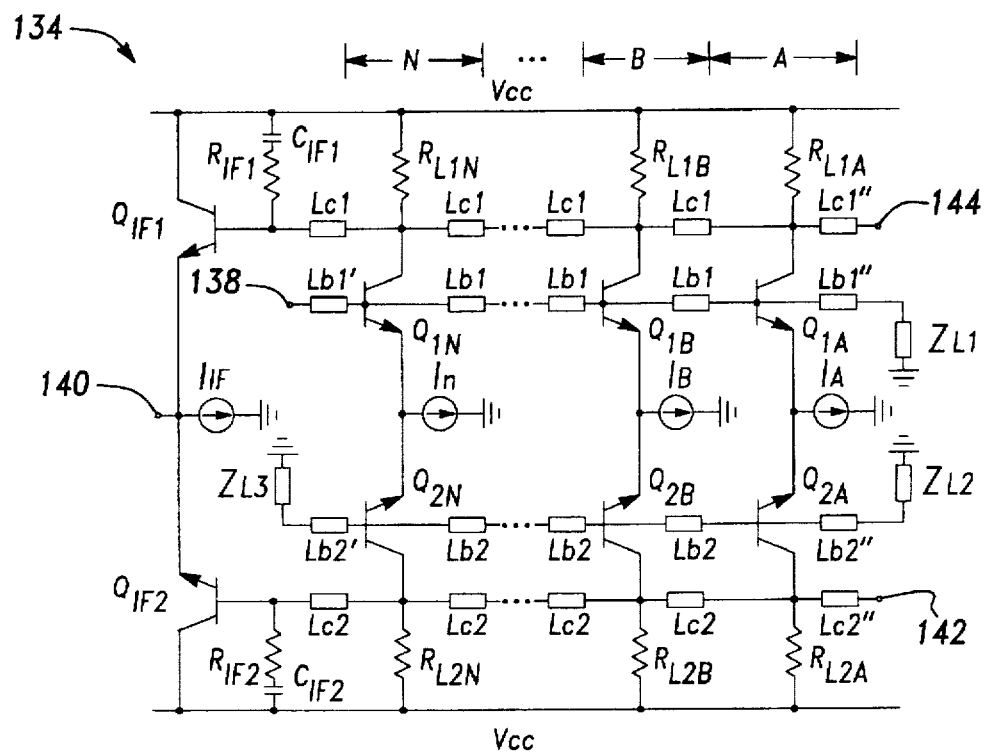
FIG. 4 illustrates an electrical schematic of a wideband distributed active balun according to the present invention which can be alternately employed in the mixer of FIG. 2.

In FIG. 4, a first distributed active balun 134 is illustrated and includes an input 138, an intermediate frequency (IF) output center tap 140, a non-inverting output 142, and an inverting output 144. First distributed active balun 134 can be connected in a manner similar to active baluns 34 and 36 in FIG. 2. Note that input 138 is coupled to an RF input or a LO input as with baluns 34 and 36.

First distributed active balun 134 include a plurality of sections A, B, . . . , N. Each section includes a distributed differential amplifier including complementary transistors $Q_{1x}$ and $Q_{2x}$, and current sources $I_x$ where x represents the different sections A, B, C, . . . N. Inductive base elements $L_{b1}$ and $L_{b2}$ completes artificially constructed input transmission lines in conjunction with transistors $Q_{1x}$ and $Q_{2x}$, respectively. Inductive collector elements $L_{c1}$ and $L_{c2}$ complete artificially constructed output transmission lines in conjunction with transistors $Q_{1x}$ and $Q_{2x}$, respectively. Preferably, input and output transmission lines are designed in the same manner as a conventional FET distributed amplifier.

The RF or LO input is connected at 138 to one end of inductive base element $L_{b1}'$ and an opposite end of inductive base element of $L_{b1}'$ is coupled to a base of transistor $Q_{1n}$. One end of inductive base element $L_{b1}"$ is connected to a base of transistor $Q_{1A}$ and an opposite end is coupled to a terminating impedance $Z_{L1}$. Otherwise, inductive base elements $L_{b1}$ connect bases of adjacent transistors, for example $Q_{1A}$ and $Q_{1B}$.

Inductive base element $L_{b2}'$ has one end connected to a terminating impedance $Z_{L3}$ and an opposite end connected to transistor $Q_{2N}$. Inductive base element $L_{b2}"$ has one end connected to terminating impedance $Z_{L2}$ and an opposite end connected to a base of transistor $Q_{2A}$. Otherwise, inductive base elements $L_{b2}$ couple bases of adjacent transistors, for example transistors $Q_{2A}$ and $Q_{2B}$.

Collectors of transistors $Q_{1x}$ and $Q_{2x}$ are DC loaded by respective load resistors $R_{L1x}$ and $R_{L2x}$ where x represents the respective distributive sections.

The total effective load resistance $R_{EFF}$ is equivalent to the load resistances $R_{L1x}$ and $R_{L2x}$ in parallel and the total effective current $I_{EFF}$ is equivalent to the total collector current of one side of the distributed amplifier. The product of $R_{EFF}$ and $I_{EFF}$ must be set greater than the turn-on voltage of the Schottky diodes of the ring quad 58.

Inverting and non-inverting outputs 144 and 142 of first distributed active balun 134 are taken at one end of inductive collector elements $L_{c1}"$ and $L_{c2}"$. Inductive collector elements $L_{c1}'$ and $L_{c2}'$ are terminated by a series RC network including $R_{IF1}$, $C_{IF1}$ and $R_{IF2}$, $C_{IF2}$. Otherwise inductive collector elements $L_{c1}$ and $L_{c2}$ couple collectors of adjacent transistors, for example $L_{c2}$ couples collectors of transistors $Q_{2A}$ and $Q_{2B}$. The series RC network terminations act as a matched termination at high frequencies and as a high impedance load at low frequencies.

The IF output signal is tapped or coupled out at 140 through emitter-followers including transistors $Q_{IF1}$ and $Q_{IF2}$ and current source $I_{IF}$. The in-phase intermediate frequency signals at the output node 140 are combined through the emitters of transistors $Q_{IF1}$ and $Q_{IF2}$. First distributed balun 134 is self biased by a voltage supply $V_{cc}$.

Preferably transistors $Q_{1x}$, $Q_{2x}$, $Q_{IF1}$, and $Q_{IF2}$ are implemented in hetero-junction bipolar (HBT) technology or bipolar junction technologies (BJT).

If first distributed active balun 134 employs HBT or BJT technology, first distributed active balun 134 may suffer from a loss of attenuation due to the resistive parasitics of the HBT or BJT devices. A technique for enhancing the gain-bandwidth response of a distributed transmission line network using HBTs is described in U.S. patent application Ser. No. 08/433,266 entitled "Loss Compensated Gain Cell For Distributed Amplifier" to Kobayashi filed May 2, 1995 which is hereby incorporated by reference. This disclosure describes an attenuation compensation multi-transistor topology which has the characteristics of lower input and output loss as compared to a conventional common-emitter device.

As can be appreciated, a mixer incorporating first distributed active balun 134 provides high conversion gain, IP3 and isolation at microwave frequencies while requiring a low DC voltage, dissipating low DC power and consuming small chip area. Furthermore, a mixer incorporating first distributed active balun 134 has an extended bandwidth as compared to active baluns 34 and 36.

Figure 5:
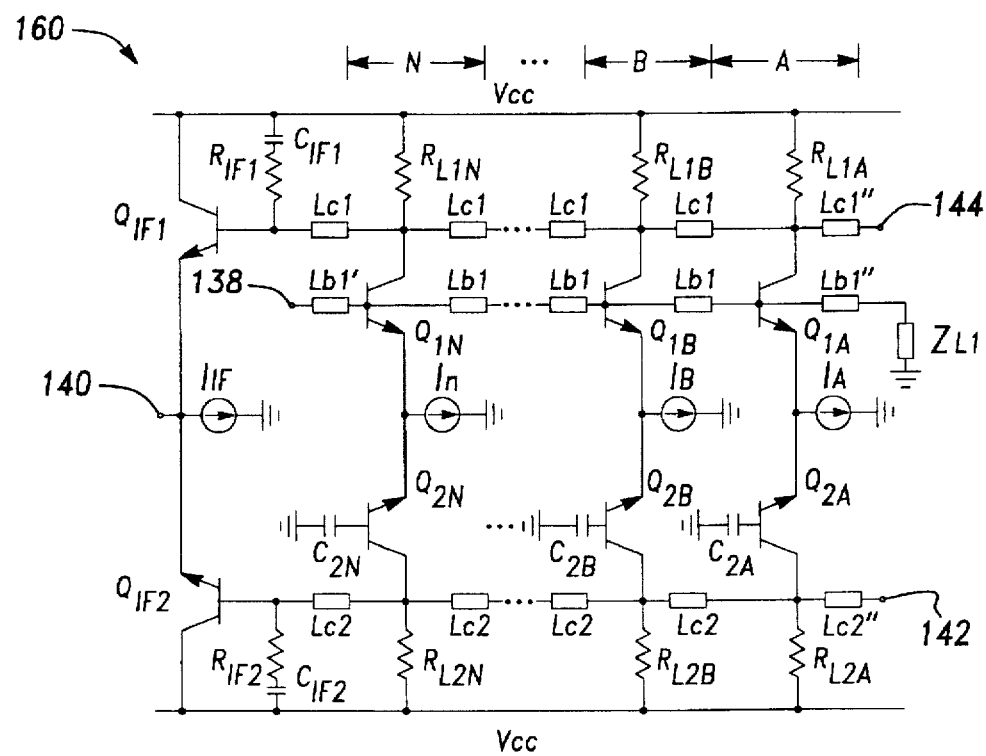
FIG. 5 illustrates a second embodiment of a wideband distributed active balun which can be alternately employed in the mixer of FIG. 2.

In FIG. 5, a second distributed active balun 160 is illustrated. For purposes of clarity, reference numerals from FIG. 4 will be used where appropriate. The distributive transmission lines defined $L_{b2}$, $L_{b2}'$, and $L_{b2}"$ which connected bases of transistors $Q_{2A}$, $Q_{2B}$, . . . , $Q_{2N}$ are removed. Instead, each transistor $Q_{2A}$, $Q_{2B}$, . . . , $Q_{2N}$ operates as a common-base amplifier. The base of each transistor $Q_{2A}$, $Q_{2B}$, . . . , $Q_{2N}$ is connected by a capacitor $C_{2A}$, $C_{2B}$, . . . $C_{2N}$ to ground to provide an AC short circuit. The base bias of transistors $Q_{2A}$, $Q_{2B}$, . . . , $Q_{2N}$ can be realized by conventional means and are not described. The second active balun 160 uses common emitter transistors $Q_{1A}$, $Q_{1B}$, . . . , $Q_{1N}$ to achieve out of phase outputs and common-base transistors $Q_{2A}$, $Q_{2B}$, . . . , $Q_{2N}$ to achieve in-phase outputs. Second distributed active balun 160 eliminates the additional transmission line constructed of $L_{b2}$, $L_{b2}'$ and $L_{b2}"$ and allows an alternate way of implementing the distributed active balun while saving layout space and reducing layout complexity. Second distributed active balun 160 provides similar performance benefits provided by first distributed balun 134, described above.

Figure 6:
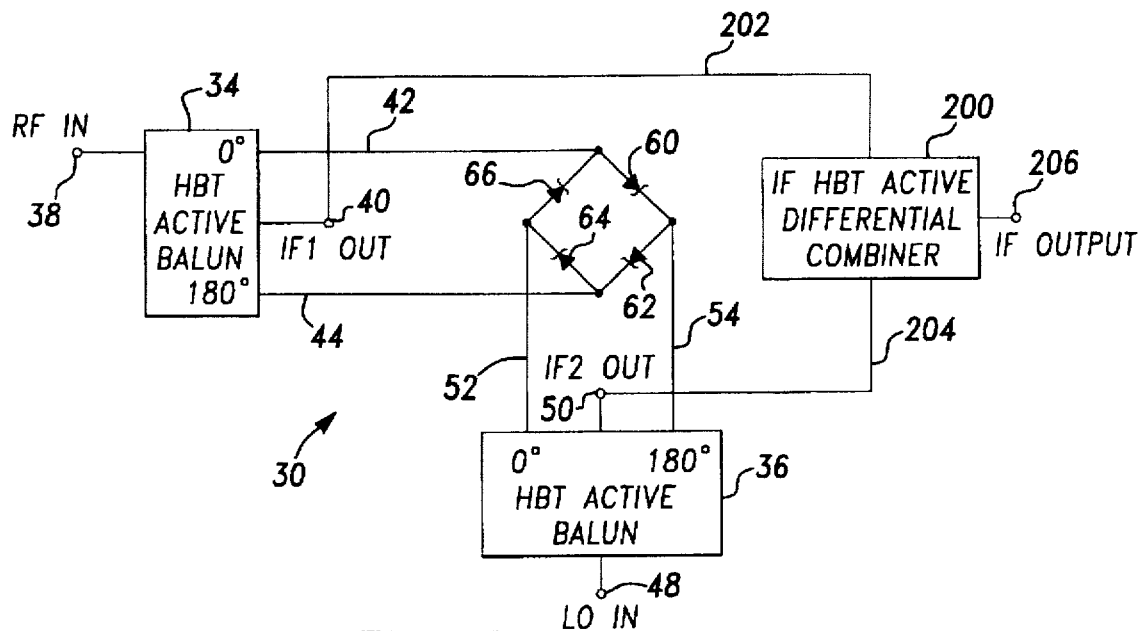
FIG. 6 is a block diagram of the mixer of FIG. 2 with an IF differential combiner according to the present invention.
Figure 7:
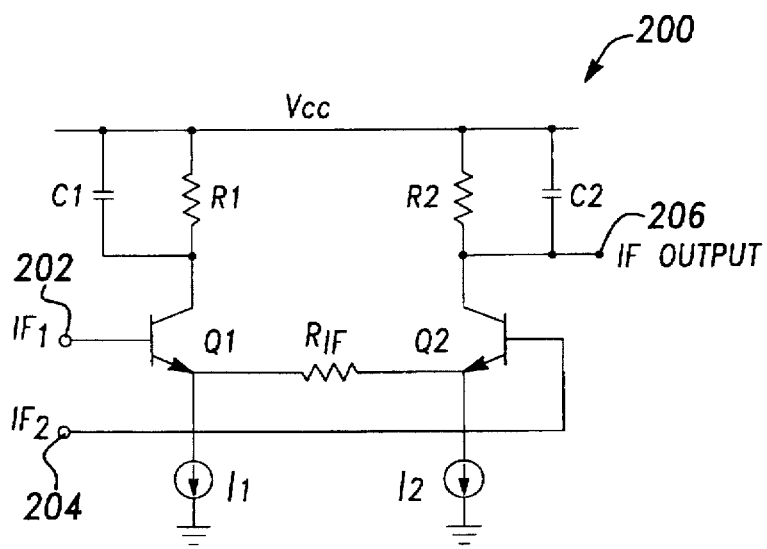
FIG. 7 is an electrical schematic of the active differential IF combiner of FIG. 6 in further detail.

Referring to FIGS. 6 and 7, a differential combiner 200 is illustrated. In the interest of clarity, reference numerals from FIG. 2 have been used where appropriate. Differential combiner 200 includes first and second inputs 202 and 204 coupled to $IF_1$ output and $IF_2$ output 40 and 50. Differential combiner 200 further includes an output 206 and combines complementary $IF_1$ output 40 and $IF_2$ output 50 using a differential IF amplifier.

With reference to FIG. 7, differential combiner 200 is illustrated in further detail. Complementary IF outputs of the Schottky mixer quad 58 are input to differential inputs of a differential amplifier including transistors $Q_1$ and $Q_2$. Transistor $Q_1$ has an emitter which is coupled to a current source $I_1$ and an emitter degeneration resistor $R_{IF}$. Input 202 is coupled to $IF_1$ output 40 and a base of transistor $Q_1$. Input 204 is coupled to $IF_2$ output 50 and a base of transistor $Q_2$. A collector of transistor $Q_1$ is coupled to one end of resistor $R_1$ and capacitor $C_1$. A collector of transistor $Q_2$ is coupled to one end of resistor $R_2$, one end of capacitors $C_2$, and combined IF output 206.

Load resistors $R_1$ and $R_2$ are chosen to provide IF output impedance match. Bias currents $I_1$ and $I_2$ are designed to provide the desired output power. Emitter degeneration resistor $R_{IF}$ is adjusted for linearity performance as well as gain bandwidth response. Shunt capacitors $C_1$ and $C_2$ provide low pass filtering of the LO and RF signals at the IF output. The circuit is self biased through a single voltage supply $V_{cc}$.

In use, differential combiner 200 combines complementary $IF_1$ output 40 and complementary $IF_2$ output 50 into a combined IF output at node 206. Preferably transistors $Q_1$ and $Q_2$ are either HBT or BJT transistors. In a highly preferred embodiment, GaAs HBT transistors are employed.

As can be appreciated from the foregoing, an active balanced mixer according to the invention is direct-coupled to the diode ring and therefore can operate from baseband to high frequencies. Using the distributed active baluns according to the invention, operation can be increased to frequencies greater than 20 GHz. The positive conversion gain of the active balanced mixers reduces the number of amplifiers required in a mixer. The active balanced mixer according to the present invention provides high third order intercept (IP3) performance as compared to other conventional mixers. The active balanced mixer also has excellent isolation performance which surpasses conventional mixer design. The active balanced mixer is also small in size and therefore requires less chip space. The active balanced mixer also requires low voltage to operate while maintaining high IP3 performance whereas other conventional mixers tradeoff increased operating voltage for increased IP3 performance.

The various advantages of the present invention will become apparent to those skilled in the art after a study of the foregoing specification and following claims.

What is claimed is:

1. A low-power, high performance mixer comprising:
   a diode ring;
   first active means, having an input coupled to a radio frequency (RF) signal, for generating a first intermediate frequency (IF) output and a set of balanced RF outputs which are directly coupled to said diode ring; and second active means, having an input coupled to a local oscillator (LO) signal, for generating a second IF output and a set of balanced LO outputs which are directly coupled to said diode ring.

2. The mixer of claim 1 wherein said diode ring is a Schottky diode ring including first, second, third and fourth diodes.

3. The mixer of claim 2 wherein said set of balanced RF outputs includes a non-inverting RF output and an inverting RF output, and wherein said set of balanced LO outputs includes a non-inverting LO output and an inverting LO output.

4. The mixer of claim 3 wherein said first active means includes a plurality of transistors, and wherein said non-inverting RF output is directly coupled to an anode of said first diode, and said inverting RF output is directly coupled to an anode of said third diode.

5. The mixer of claim 4 wherein said second active means includes a plurality of transistors, and wherein said non-inverting LO output is directly coupled to an anode of said fourth diode, and said inverting LO output is directly coupled to an anode of said second diode.

6. The mixer of claim 1 wherein at least one of said first and second active means is an active balun comprising:
   a first transistor;
   an emitter resistor; and
   a second transistor having an emitter coupled to one end of said emitter resistor, wherein an opposite end of said emitter resistor is coupled to an emitter of said first transistor.

7. The mixer of claim 6 wherein said active balun includes:
   a first current source coupled to said emitter of said first transistor; and
   a second current source coupled to said emitter of said second transistor.

8. The mixer of claim 7 wherein said active balun includes:
   a first load resistor coupled to a collector of said first transistor and to at least one of an inverting RF output and an inverting LO output; and
   a second load resistor coupled to a collector of said second transistor and to at least one of a non-inverting RF output and a non-inverting LO output.

9. The mixer of claim 8 wherein said active balun includes:
   a third current source;
   a third transistor;
   a fourth transistor having an emitter coupled to an emitter of said third transistor, said third current source and at least one of said first IF output and said second IF output,
   wherein said base of said third transistor is coupled to said collector of said first transistor, and said base of said fourth transistor is coupled to said collector of said second transistor.

10. The mixer of claim 9 wherein said active balun includes:
    fourth and fifth current sources;
    a fifth transistor having an emitter coupled to said fourth current source and to a base of said first transistor;
    a sixth transistor having an emitter coupled to said fifth current source and to a base of said second transistor.

11. The mixer of claim 10 wherein opposite ends of said first and second load resistors of said active balun are coupled to a voltage source.

12. The mixer of claim 11 wherein collectors of said third and fourth transistors of said active balun are coupled to said voltage source.

13. The mixer of claim 12 wherein said active balun includes:

a first resistor having one end coupled to a base of said fifth transistor and at least one of said RF and LO inputs; and a second resistor having one end coupled to a base of said sixth transistor, wherein collectors of said fifth and sixth transistors and opposite ends of said first and second resistors are coupled to said voltage source.

14. The mixer of claim 13 wherein said first, second, third, fourth, fifth and sixth transistors are bipolar transistors.

15. The mixer of claim 14 wherein said first, second, third, fourth, fifth and sixth transistors are hetero-junction bipolar technologies transistors.

16. The mixer of claim 1 further comprising:

IF output combining means, coupled to said first IF output and said second IF output, for generating a combined IF output from said first IF output and said second IF output.

17. The mixer of claim 16 wherein said IF output combining means comprises:

seventh and eighth transistors, wherein a base of said seventh transistors is coupled to said first IF output, a base of said eighth BT is coupled to said second IF output.

18. The mixer of claim 17 wherein said IF combining means further comprises:

third, fourth and fifth resistors;

first and second current sources, wherein said first current source is coupled to an emitter of said seventh transistor and one end of said third resistor, and said second current source is coupled to an emitter of said eighth transistor and an opposite end of said third resistor.

19. The mixer of claim 18 wherein said IF combining means further comprises:

a first capacitor having one end coupled to one end of said fourth resistor and a collector of said seventh transistor; and a second capacitor having one end coupled to one end of said fifth resistor, a collector of said eighth transistor, and said combined IF output.

20. The mixer of claim 19 wherein said IF combining means further comprises:

a voltage supply connected to an opposite end of said first capacitor, an opposite end of said second capacitor, an opposite end of said fourth resistor, and an opposite end of said fifth resistor.

21. A wideband mixer, comprising:

a diode ring;

first distributed means, having an input coupled to a radio frequency (RF) signal and including a first plurality of differential amplifiers (DA's), for generating a first intermediate frequency (IF) output and a set of balanced RF outputs which are directly coupled to said diode ring; and second distributed means, having an input coupled to a local oscillator (LO) signal and including a second plurality of DA's, for generating a second IF output and a second set of balanced LO outputs which are directly coupled to said diode ring.

22. The wideband mixer of claim 21 wherein each of said DA's includes:

a first transistor having an emitter coupled to an emitter of a second transistor and to a first current source.

23. The wideband mixer of claim 22 wherein one of said first and second distributed means includes:

first transmission means for coupling said bases of said first transistors of one of said first and second plurality of DA's, wherein one end of said first transmission means is coupled to one of said RF and LO inputs and an opposite end is coupled to a first terminating impedance.

24. The wideband mixer of claim 23 wherein one of said first and second distributed means includes:

second transmission means for coupling said bases of said second transistors of one of said first and second plurality of DA's, wherein opposite ends of said second transmission means are coupled to second and third terminating impedances.

25. The wideband mixer of claim 23 wherein each of said DA's includes a capacitor having one end coupled to a base of said second transistor and an opposite end coupled to ground.

26. The wideband mixer of claim 24 wherein said one of said first and second distributed means includes:

a second current source;

a third transistor; and a fourth transistor having an emitter coupled to an emitter of said third transistor, to said second current source, and to said first IF output.

27. The wideband mixer of claim 26 wherein said one of said first and second distributed means includes:

third transmission means for coupling collectors of said first transistor of said one of said first and second plurality of DA's, wherein one end of said third transmission means is coupled to one of said inverting RF and LO outputs and an opposite end of said third transmission means is coupled to a base of said third transistor; and fourth transmission means for coupling a collector of said second transistor said one of said first and second plurality of DA's, wherein one end of said fourth transmission means is coupled to one of said non-inverting RF and LO outputs and an opposite end of said fourth transmission means is coupled to a base of said fourth transistor.

28. The distributed active balun of claim 27 wherein said one of said first and second distributed means includes:

a first resistor having one end coupled to said base of said third transistor and to said third transmission means; and a first capacitor having one end coupled to an opposite end of said first resistor.

29. The distributed active balun of claim 28 wherein said one of said first and second distributed means includes:

a second resistor having one end coupled to said base of said fourth transistor and to said fourth transmission means; and a second capacitor having one end coupled to an opposite end of said second resistor.

30. The distributed active balun of claim 29 wherein said one of said first and second distributed means includes:

a plurality of first load resistors having one end coupled to a collector of said second transistor of each of said first plurality of DA's.

31. The distributed active balun of claim 30 wherein said one of said first and second distributed means includes:

a plurality of second load resistors having one end coupled to a collector of said first BT of each of said plurality of DA's.

* * * * *